(12) United States Patent
Morikawa et al.

(10) Patent No.: US 7,328,142 B2
(45) Date of Patent: *Feb. 5, 2008

(54) DESIGN METHOD AND DESIGN SYSTEM FOR VEHICULAR LAMP, PROGRAM TO EXECUTE DESIGNING OF VEHICULAR LAMP AND RECORD MEDIUM RECORDING THE PROGRAM

(75) Inventors: Omi Morikawa, Shimizu (JP); Masahito Ishikawa, Shimizu (JP)

(73) Assignee: Koito Manufacturing Co., Ltd., Tokyo (JP)

( * ) Notice: Subject to any disclaimer, the term of this patent is extended or adjusted under 35 U.S.C. 154(b) by 624 days.

This patent is subject to a terminal disclaimer.

(21) Appl. No.: 10/406,322

(22) Filed: Apr. 4, 2003

(65) Prior Publication Data

US 2003/0191614 A1 Oct. 9, 2003

(30) Foreign Application Priority Data

Apr. 4, 2002 (JP) ............................ P2002-102958

(51) Int. Cl.
  G06G 7/48 (2006.01)
  B60Q 1/00 (2006.01)
(52) U.S. Cl. .......................................... 703/8; 362/507
(58) Field of Classification Search .................. 703/8; 362/507
  See application file for complete search history.

(56) References Cited

U.S. PATENT DOCUMENTS 5,357,440 A * 10/1994 Talbott et al. ................ 700/97
5,940,308 A * 8/1999 Ishikawa et al. ............... 703/8
6,505,961 B2 * 1/2003 Natsume ...................... 362/460
6,811,289 B2 * 11/2004 Nakata ......................... 362/516

(Continued)

FOREIGN PATENT DOCUMENTS

JP 4-081976 A 3/1992

(Continued)

OTHER PUBLICATIONS

Cooper, Stephen et al. "Achieving Competitive Advantage through Knowledge-Based Engineering." Best Practice Guide 2001.*
Lei, Yucheng et al. "Knowledge Based Design Wizard and Analysis of MSC.Acumen of Automotive Body" TJ Innova Engineering & Technology. 2000.*

(Continued)

Primary Examiner—Hugh Jones
(74) Attorney, Agent, or Firm—Sughrue Mion, PLLC

(57) ABSTRACT

Disclosed is to provide a design method and design system for a vehicular lamp, a program to execute designing of vehicular lamp and a record medium recording the program, which are capable of improving an efficiency of designing a lamp satisfying design conditions including performance conditions required as the vehicular lamp and restriction conditions given to each lamp. A vehicular lamp design system 1 includes: a database unit 2 having standard database 21 registering standard data of a lamp and technology database 22 registering technology data including shape templates utilizable as shape data; and a lamp preparation unit 3. The standard data selection part 31 of the lamp preparation unit 3 generates design data by selecting standard data from the standard database 21 based on given design conditions. The morphing control part 32 updates the design data by use of the parameterized shape templates of the technology database 22 and the like.

14 Claims, 15 Drawing Sheets

U.S. PATENT DOCUMENTS

2003/0191549 A1    10/2003    Otsuka et al.
2003/0191613 A1    10/2003    Ishikawa

FOREIGN PATENT DOCUMENTS

| | | |
|---|---|---|
| JP | 6-231197 A | 8/1994 |
| JP | 7-182391 A | 7/1995 |
| JP | 2001-035215 A | 2/2001 |
| JP | 2002-49647 A | 2/2002 |
| KR | 2001-0055740 A | 7/2001 |

OTHER PUBLICATIONS

Kochan, Anna. "Jaguar Uses Knowledge-based Tools to Reduce Model Development Times." Assembly Automation 1999.*

Wang F et al., "A conceptual approach managing design resource", Computers in Industry, Elsevier Science Publishers. Amsterdam, NL, vol. 47, No. 2, Feb. 2002, pp. 169-183, XP004334595.

Charlton C T et al., "A Web broker for component retrieval in mechanical engineering" Design Studies Elsevier UK, vol. 21, No. 2, Mar. 2000, pp. 167-186, XP002309342.

Bsharah F et al., "Requirements and strategies for the retention of automotive product data", Computer Aided Design, Elsevier Publishers BV., Barking, GB, vol. 32, No. 2, Feb. 2000, pp. 145-158, XP004188902.

Jenkins D et al., "Using computers to design nonimaging illumination systems", Proceedings of the SPIE—The International Society for Optical Engineering SPIE-Int. Soc. Opt. Eng USA, vol. 3130, 1997, pp. 196-203, XP002309343.

Kumar A et al., "Fully automated optical lens design for automotive lighting", Proceedings of the SPIE—The International Society for Optical Engineering SPIE-Int. Soc. Opt. Eng USA, vol. 3130, 1997, pp. 222-228, XP002309344.

* cited by examiner

Fig. 12

| LIGHT TYPE | PATTERN | IMAGE | PRODUCT NAME | DEVELOPMENT PERIOD | INFORMATION | SELECTION |
|---|---|---|---|---|---|---|
| ⦿ NOT SPECIFIED<br>○ 2-LIGHT TYPE<br>○ 4-LIGHT TYPE<br>○ OTHER | ⦿ NOT SPECIFIED<br>○ IRREGULAR SHAPE TYPE<br>○ LATERALLY LONG SQUARE TYPE<br>○ CIRCLE TYPE<br>○ LONGITUDINALLY LONG SQUARE TYPE | | COMBINATION HEADLAMP ▶ | | | |
| 2-LIGHT TYPE | IRREGULAR SHAPE TYPE | | COMBINATION HEADLAMP | ○ MONTHS | ☐☐☐☐ | (copy) |
| 2-LIGHT TYPE | LATERALLY LONG SQUARE TYPE | | COMBINATION HEADLAMP | × MONTHS | ☐☐☐☐ | (copy) |
| 2-LIGHT TYPE | LATERALLY LONG SQUARE TYPE | | COMBINATION HEADLAMP | △ MONTHS | ☐☐☐☐ | (copy) |
| 2-LIGHT TYPE | CIRCLE TYPE | | COMBINATION HEADLAMP | ☐ MONTHS | ☐☐☐☐ | (copy) |
| 4-LIGHT TYPE | LONGITUDINALLY LONG SQUARE TYPE | | COMBINATION HEADLAMP | ☆ MONTHS | ☐☐☐☐ | (copy) |

Fig.14

| HEADLAMP | TYPE | | |
|---|---|---|---|
| COMPONENT | ○-TYPE REFLECTOR | □-TYPE REFLECTOR | ×-TYPE REFLECTOR |
| REFLECTOR | | | |
| BULB | H BULB | D BULB | G BULB |
| LENS STEP | A STEP | B STEP | NONE |
| SHADE | SQUARE | CIRCLE | NONE |
| FRONT-TURN SHAPE | CIRCLE | OTHER | NONE |
| CLEARANCE | TYPE I | TYPE II | TYPE III |
| EXTENSION | PRESENT | | |

54

DESIGN METHOD AND DESIGN SYSTEM FOR VEHICULAR LAMP, PROGRAM TO EXECUTE DESIGNING OF VEHICULAR LAMP AND RECORD MEDIUM RECORDING THE PROGRAM

BACKGROUND OF THE INVENTION

1. Field of the Invention

The present invention relates to a design method and design system for a vehicular lamp used for vehicles such as an automobile and relates to a program for allowing a computer to execute designing of the vehicular lamp and a computer-readable record medium recording the program.

2. Related Background Art

Regarding a vehicular lamp, besides (1) conditions from aspects related to functions and performance as a lamp, because of its use in a state of being attached to a vehicle such as an automobile and the like, restriction conditions such as (2) conditions from aspects related to its shape (shape restriction conditions), (3) conditions from aspects related to its external appearance (appearance restriction conditions) and the like are imposed thereon. Therefore, in designing the lamp, it is required to realize a lamp in which the restriction conditions from given aspects of the shape and external appearance are satisfied and performance conditions thereof are optimized.

As the conditions from the aspect of performance, there are conditions from aspects of an optical performance such as a luminous intensity distribution pattern and the like, a structural performance, a thermal performance and the like, the conditions being required according to types of the lamp as the function of the vehicular lamp. Moreover, regarding the restriction conditions from the aspect of a car body, as the shape restriction conditions, there are conditions related to volume and shape of a lamp housing portion provided in the car body, to a shape of a lens outer surface of the lamp, the shape being continuous with other portions of the car body, and the like. Moreover, as the appearance restriction conditions, there are conditions related to a harmony between the external appearance thereof and an external appearance of the other portions of the car body, to a design of the car body and the like.

SUMMARY OF THE INVENTION

The restriction conditions upon designing, such as the shape and appearance restriction conditions and the like with respect to the vehicular lamp, are usually given as individual design conditions for every lamp according to the shape and external appearance designs of the car body using the lamp. Therefore, in designing such a lamp, it is necessary to consider the restriction conditions given to the lamp to be designed and to design the lamp so as to satisfy performance conditions necessary as the vehicular lamp regarding each performance such as the optical performance as to light emitted from the lamp.

Constitution, shape and the like of such a vehicular lamp are designed so as to satisfy the restriction conditions given thereto, while referring, to some degree, to necessary performance conditions such as a luminous intensity distribution pattern, for example, having certain light uniformity and light diffusion, as to a design procedure of the lamp. Then, for the designed lamp, the performance thereof is evaluated by performing a simulation of the luminous intensity distribution and the like. When the lamp does not satisfy the necessary performance conditions in the evaluation result, the lamp is redesigned by changing a part of the constitution, shape and the like of the evaluated lamp or by starting over the design of the lamp.

However, by use of such a design method, there is a problem that a design efficiency of the lamp is lowered due to the contents of the restriction conditions given to the lamp, a specific procedure used in the steps of designing or redesigning the lamp and the like. For example, when the constitution of the lamp designed so as to satisfy the restriction conditions from the aspect of the car body is depart from a constitution satisfying performance conditions necessary in the early stage, redesigning thereof is repeated many times until a lamp satisfying the performance conditions is finally obtained. Thus, the design efficiency of the lamp is significantly lowered.

The present invention is made in order to solve the above-described problems. It is the object of the present invention to provide a design method and design system for a vehicular lamp, a program for allowing a computer to execute designing of the vehicular lamp and a record medium recording the program, which are capable of improving a design efficiency of a lamp satisfying design conditions including performance conditions required as the vehicular lamp and restriction conditions given to each lamp.

In order to achieve the above-described object, the design method for a vehicular lamp according to the present invention is a method for designing a vehicular lamp, comprising: (1) a standard data selection step for generating design data by selecting one piece of standard data from a plurality of standard data registered in a standard database based on design conditions including a performance condition required as the vehicular lamp and a restriction condition given to each lamp; and (2) a morphing step for preparing lamp data satisfying the design conditions by updating a necessary part of the design data, the morphing step including a shape design step of updating shape data in the design data by obtaining a shape template from a technology database and setting a value of a shape parameter; wherein (3) the standard database is a database registering the plurality of standard data utilizable as source data of the design data used for lamp designing, the standard data being prepared, respectively, in a predetermined data format having at least constitution data about a constitution of the lamp; and (4) the technology database is a database registering the shape template having the shape parameter for deformation, to be the shape data of the lamp in the design data.

Moreover, the design system for a vehicular lamp according to the present invention is a design system designing a vehicular lamp, comprising: (1) a standard database registering a plurality of standard data utilizable as source data of design data used for lamp designing, the standard data being prepared, respectively, in a predetermined data format having at least constitution data about a constitution of the lamp; (2) a technology database registering a shape template having a shape parameter for deformation, to be shape data of the lamp in the design data; (3) standard data selection means for generating design data by selecting one piece of standard data from the plurality of standard data registered in the standard database based on design conditions including a performance condition required as the vehicular lamp and a restriction condition given to each lamp; and (4) morphing control means for preparing lamp data satisfying the design conditions by updating a necessary part of the design data, the morphing control means including shape design means for updating the shape data in the design data by obtaining the shape template from the technology database and setting a value of the shape parameter.

Moreover, the program according to the present invention is a program for allowing a computer to execute designing of a vehicular lamp, the program being for allowing the computer to execute: (1) a standard data selection processing for generating design data by selecting one piece of standard data from a plurality of standard data registered in a standard database based on design conditions including a performance condition required as the vehicular lamp and a restriction condition given to each lamp; and (2) a morphing control processing for preparing lamp data satisfying the design conditions by updating a necessary part of the design data, the morphing control processing including a shape design processing of updating shape data in the design data by obtaining a shape template from a technology database and setting a value of a shape parameter; wherein (3) the standard database is a database registering the plurality of standard data utilizable as source data of the design data used for lamp designing, the standard data being prepared, respectively, in a predetermined data format having at least constitution data about a constitution of the lamp; and (4) the technology database is a database registering the shape template having the shape parameter for deformation, to be the shape data of the lamp in the design data.

The record medium according to the present invention is a computer-readable record medium recording a program for allowing a computer to execute designing of a vehicular lamp, the program being for allowing the computer to execute: (1) a standard data selection processing for generating design data by selecting one piece of standard data from a plurality of standard data registered in a standard database based on design conditions including a performance condition required as the vehicular lamp and a restriction condition given to each lamp; and (2) a morphing control processing for preparing lamp data satisfying the design conditions by updating a necessary part of the design data, the morphing control processing including a shape design processing for updating the shape data in the design data by obtaining the shape template from a technology database and setting a value of a shape parameter; wherein (3) the standard database is a database registering the plurality of standard data utilizable as source data of the design data used for lamp designing, the standard data being prepared, respectively, in a predetermined data format having at least constitution data about a constitution of the lamp; and (4) the technology database is a database registering the shape template having the shape parameter for deformation, to be the shape data of the lamp in the design data.

In the above-described design method and design system for a vehicular lamp, program to execute designing of vehicular lamp and record medium recording the program, regarding the design of the vehicular lamp, prepared are: the standard database registering the standard data for the entire constitution of the lamp; and the technology database registering the technology data for a part of the constitution of the lamp, the technology data including shape templates for the shape thereof. Then, the lamp data are prepared by using the selected standard data as the source data and by referring to necessary technology data.

Here, the standard data, that is data of a standard lamp, is composed of lamp data of a standard lamp selected from lamps already designed, for example. Such a standard lamp is usually designed so as to satisfy performance conditions required as a vehicular lamp, such as a luminous intensity distribution pattern and the like. Meanwhile, as the technology data applied to the design data, shape templates that can be suitably applied to the shape data in the design data of the lamp and the like are selected and registered.

Therefore, by designing the lamp by utilizing the above-described standard data and technology data, it is made possible to improve the design efficiency of the lamp satisfying the design conditions including the performance conditions and the restriction conditions. Particularly, specific shapes of the shape templates utilized as the shape data of the lamp can be set or changed by the shape parameters. By use of such shape templates, the preparation of the shape data of the respective parts of the lamp in the design data is facilitated.

Moreover, the standard data registered in the standard database are prepared in a unified data format, and the lamp is designed by use of the prepared data as the design data. Thus, a preparation procedure of the lamp data taking the standard data as the source data is simplified. Moreover, adoption of the data format as described above is useful from the viewpoint of sharing of the lamp data among respective workers designing the lamp, manufacturing the lamp or the like, or from the viewpoint of utilization of the lamp data after the designing thereof. Moreover, the use of the technology data such as the shape templates converted into a database as the data for updating the design data is also useful similarly from the viewpoint of the sharing and utilization of the lamp data.

BRIEF DESCRIPTION OF THE DRAWINGS

FIG. 12 is a view showing another example of a design screen for selecting the standard data.

FIG. 14 is a view showing one example of a design screen for obtaining the technology data.

DESCRIPTION OF THE PREFERRED EMBODIMENTS

Figure 1:
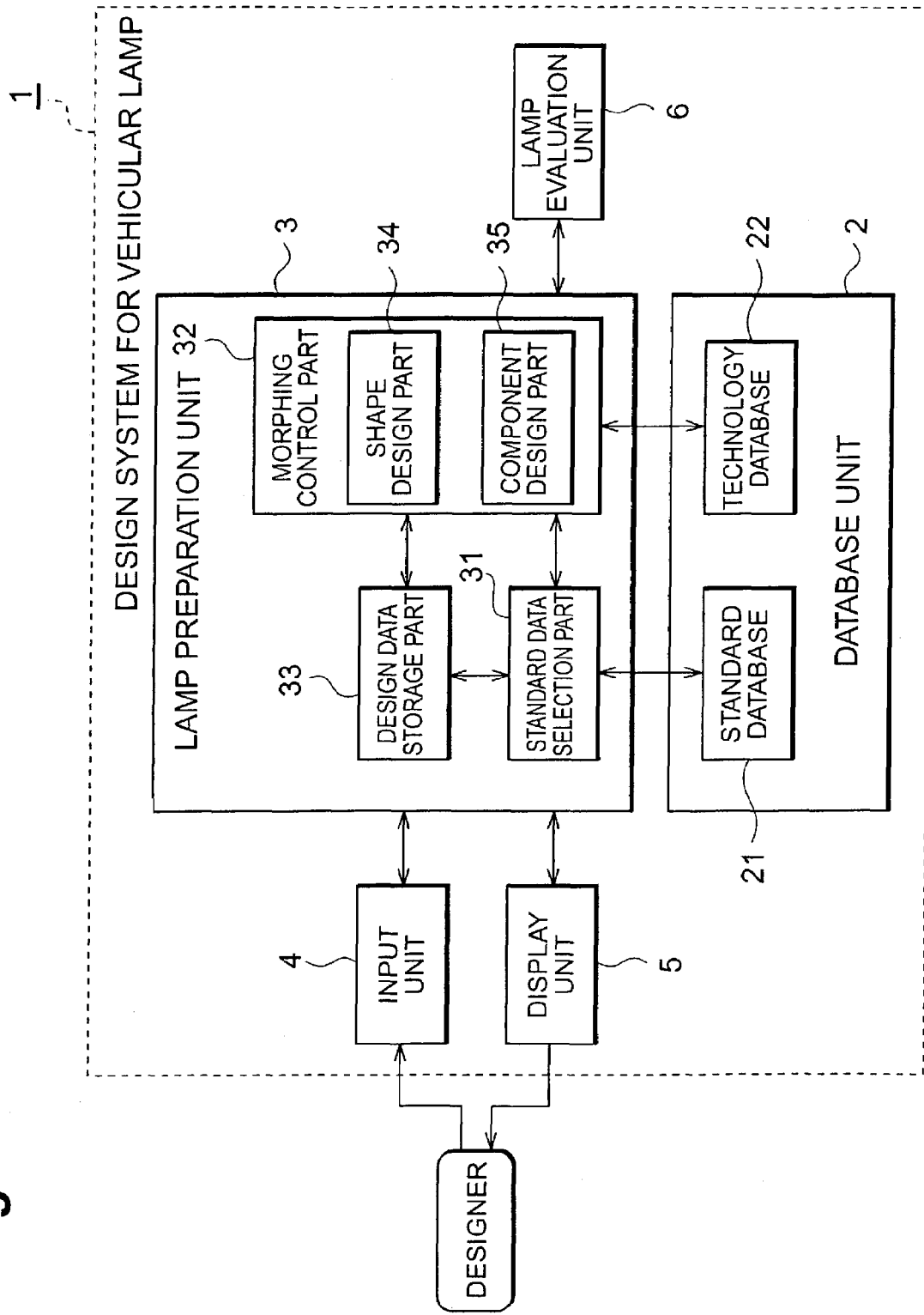
FIG. 1 is a block diagram showing a constitution of a design system of a vehicular lamp according to one embodiment.

Hereinafter, detailed description will be made with reference to the drawings for preferred embodiments of a design method and design system for a vehicular lamp, a program for allowing a computer to execute designing of the vehicular lamp and a computer-readable record medium recording the program according to the present invention. Note that, in the description of the drawings, the same constituent components are denoted by the same reference numerals and thus repetitive description thereof will be omitted. Moreover, dimensional ratios of the drawings do not necessarily coincide with those in the description.

FIG. 1 is a block diagram showing a constitution of one embodiment of a design system of a vehicular lamp according to the present invention. This vehicular lamp design system 1 is a design system for preparing lamp data based on design conditions given to a vehicular lamp to be designed, the system being constituted of a database unit 2, a lamp preparation unit 3, an input unit 4 and a display unit 5.

The database unit 2 is a data storage unit storing data used for preparing the lamp data in this design system 1. In this embodiment, two kinds of database, including a standard database 21 and a technology database 22, are prepared in the database unit 2. The standard database 21 is a database registering a plurality of standard data utilizable, respectively, as source data of design data used for lamp designing.

Moreover, the technology database 22 is a database registering technology data utilizable in the lamp designing in which final lamp data satisfying the design conditions are prepared. As specific technology data, shape templates having shape parameters for deformation are registered in the technology database 22, the shape templates being utilizable as shape data of the lamp in the design data. Further necessary technical data such as standard component data are registered, the necessary technical data being utilizable as component data of the lamp in the design data.

The lamp preparation unit 3, by use of the data stored in the database unit 2 and the like, prepares the lamp data based on an instruction from a designer or by an automatic processing. This lamp preparation unit 3 has a standard data selection part 31, a morphing control part 32 and a design data storage part 33.

The standard data selection part 31 selects one piece of standard data suitable for the lamp from the plurality of standard data registered in the standard database 21, based on the design conditions for the lamp to be designed. Then, by use of the selected standard data, the design data used for preparing the lamp data are generated.

The morphing control part 32 performs morphing for the generated design data according to need. Specifically, as to a necessary part of the design data generated from the standard data, a part of or all of the design data are updated by using the technology data obtained from the technology database 22 and by performing modifications of the data, such as a change in the constitution of the lamp, a change in shape thereof and the like. Thus, the lamp data satisfying the design conditions are prepared.

In this embodiment, the morphing control part 32 has a shape design part 34 and a component design part 35. The shape design part 34 obtains a necessary shape template from the technology data registered in the technology database 22. Then, the shape design part 34 sets a value of a shape parameter in the obtained shape template, applies the shape template to the design data and updates the shape data in the design data. Moreover, the component design part 35 obtains necessary standard component data from the technology data registered in the technology database 22. Then, the component design part 35 applies the obtained standard component data to the design data and updates the component data in the design data.

Moreover, the design data generated from the standard data selected by the standard data selection part 31 and the design data partially or entirely updated by the morphing control part 32 are stored in the design data storage part 33. The stored data are referred to or updated according to need.

The input unit 4 and the display unit 5 are provided for the lamp preparation unit 3 preparing the lamp data based on the given design conditions, in order to exchange necessary information between the designer designing the lamp and the lamp preparation unit 3 of the design system 1. The input unit 4 is input means used by the designer to input information related to the designing of the lamp to the lamp preparation unit 3. Moreover, the display unit 5 is display means for displaying information referred to in the designing of the lamp from the lamp preparation unit 3 to the designer.

To be specific, the designer can instruct, via the input unit 4, the standard data selection part 31 of the lamp preparation unit 3 to select one piece of standard data to be the design data from the plurality of standard data registered in the standard database 21. In this event, the input unit 4 functions as selection instruction means of the standard data. Moreover, the designer can instruct, via the input unit 4, the morphing control part 32 of the lamp preparation unit 3 to update a necessary part of the design data generated from the standard data. In this event, the input unit 4 functions as update instruction means of the design data.

Meanwhile, the display unit 5 functions as the display means for displaying, by use of the lamp preparation unit 3, a design screen showing necessary information to the designer. For example, regarding the selection of the standard data, the display unit 5 displays a selection design screen showing the plurality of standard data registered in the standard database 21. Alternatively, regarding the obtainment of the technology data, the display unit 5 displays a technology design screen showing the technology data registered in the technology database 22. Alternatively, regarding the update of the design data, the display unit 5 displays an update design screen showing the design data to be updated by use of the technology data.

Moreover, in the design system 1 of this embodiment, a lamp evaluation unit 6 is provided for the foregoing lamp preparation unit 3. As to the lamp data such as the design data generated in the standard data selection part 31 of the lamp preparation unit 3, the design data updated in the morphing control part 32 or the like, the lamp evaluation unit 6 performs evaluation of the lamp based on the instruction from the designer or by an automatic processing. Specifically, the lamp evaluation unit 6 evaluates whether or not the lamp to be designed satisfies the given design conditions.

Figure 2:
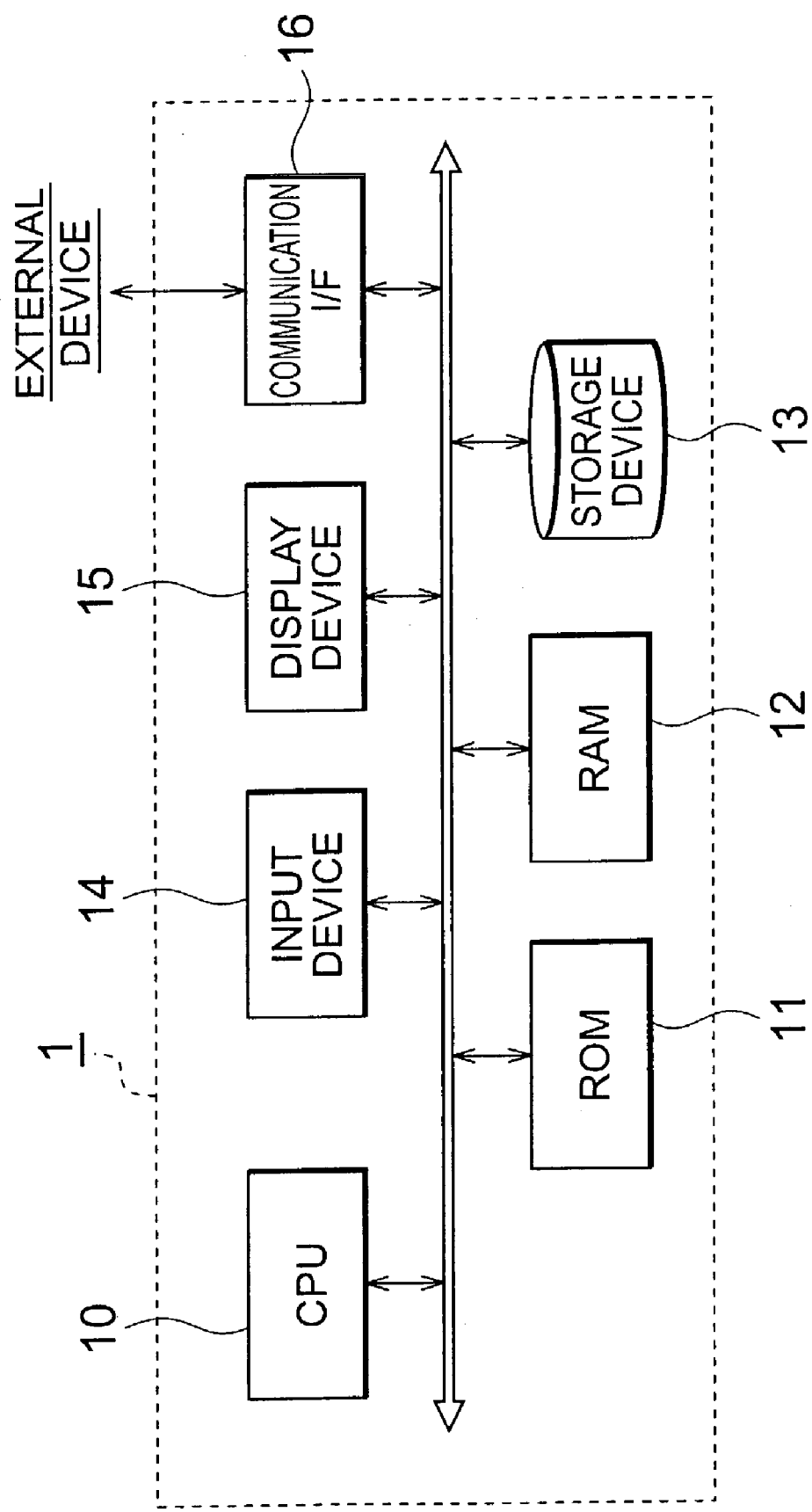
FIG. 2 is a block diagram showing one example of a hardware configuration used in the design system of the vehicular lamp shown in FIG. 1.

FIG. 2 is a block diagram showing one example of a hardware configuration used in the design system of the vehicular lamp shown in FIG. 1. Software processing activities in the design system 1 shown in FIG. 1 and processing corresponding to respective steps in the design method for a vehicular lamp, which is performed by this design system 1, are feasible by a program for allowing a computer to execute designing of the vehicular lamp. Specifically, the software processing activities include: the selection of the standard data and the generation of the design data in the standard data selection part 31; the update of the design data in the morphing control part 32; the reception of the input from the input unit 4; the instruction of the display to the display unit 5; and the like. In other words, these software processing activities are carried out, for example, by a CPU 10 executing the program for designing the vehicular lamp in the hardware configuration shown in FIG. 2.

To the CPU 10, connected are: a ROM 11 storing respective software programs necessary for processing operations of the design system 1; and a RAM 12 temporarily storing data during execution of the program. Moreover, to the CPU 10, an external storage device 13, such as a hard disc and the like, is connected. This external storage device 13 is used as a storage device storing respective data such as the data stored in the database unit 2 including the standard database 21 and the technology database 22, the design data stored in the design data storage part 33 and the like.

To the above-described devices such as the CPU 10, an input device 14 corresponding to the input unit 4 of FIG. 1 and a display device 15 corresponding to the display unit 5 are connected. Thus, the vehicular lamp design system 1 of this embodiment is constituted. As the input device 14, for example, a pointing device such as a mouse, a keyboard or the like is used. Moreover, as the display device 15, a CRT display, a liquid crystal display or the like is used. Moreover, when it is necessary to exchange the lamp data and the like between the design system 1 and an external device used by another designer or the like, a communication I/F 16 is provided for connection to the external device.

Moreover, the foregoing designing program for allowing the CPU 10 to execute the respective processing for designing the vehicular lamp is distributable by being recorded in a computer-readable record medium. Such a record medium includes, for example: a magnetic medium such as a hard disc, a floppy disk and the like; an optical medium such as a CD-ROM, a DVD-ROM and the like; a magneto-optical medium such as a floptical disk and the like; a hardware device such as, for example, a RAM, a ROM, a semiconductor nonvolatile memory and the like, which is specially disposed so as to execute or store program instructions; and the like. Moreover, a drive for reading recording media (for example, a floppy disk drive and the like) that reads the program and the like from the record medium described above may be connected to the CPU 10.

Figure 3:
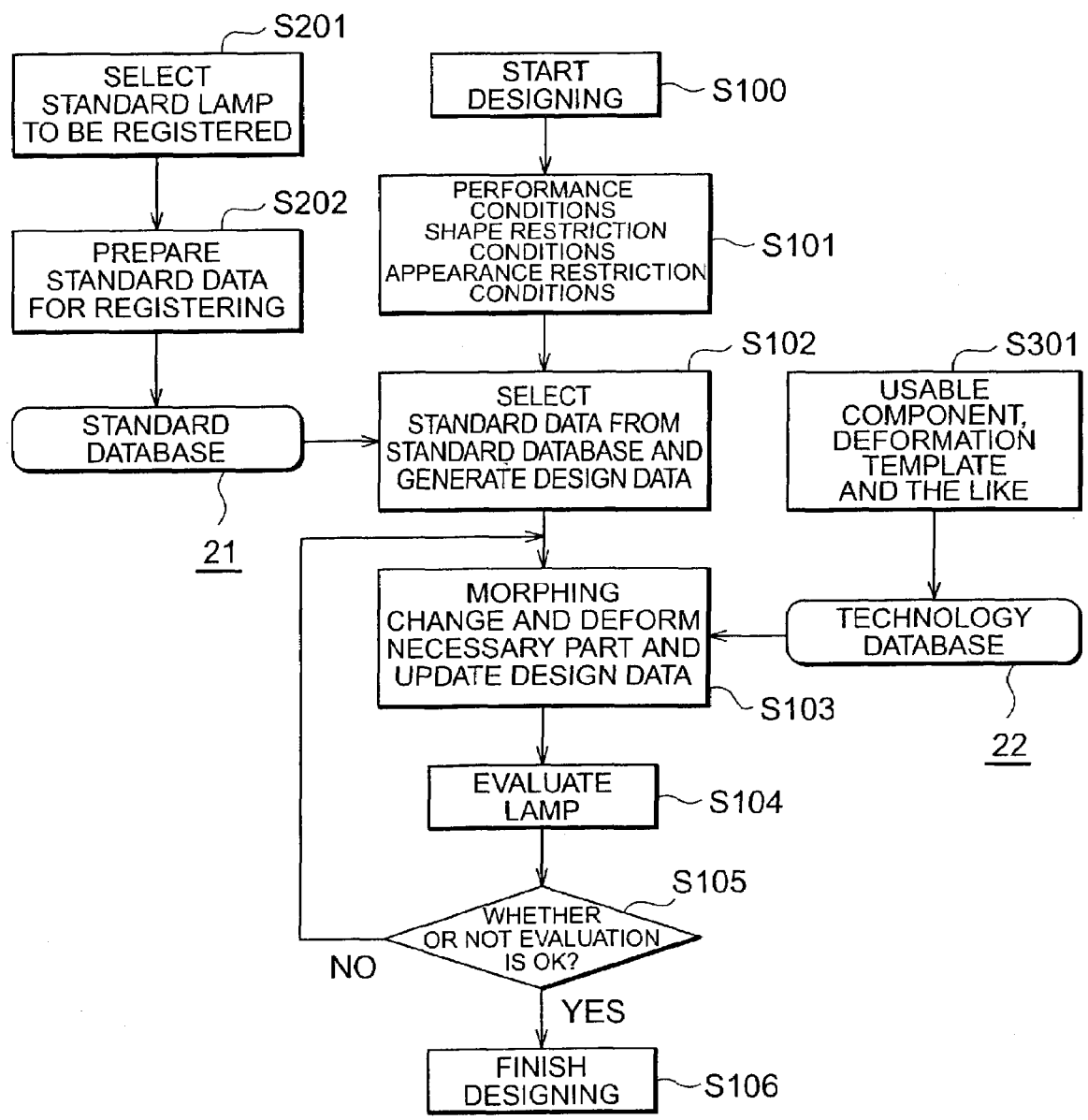
FIG. 3 is a flowchart schematically showing one embodiment of a method for designing the vehicular lamp.

FIG. 3 is a flowchart schematically showing one embodiment of the design method for a vehicular lamp according to the present invention. With reference to the constitution of the design system 1 shown in FIG. 1, the design method for a vehicular lamp will be described below.

First, the standard database 21 and the technology database 22 will be described, which are prepared in the database unit 2 as the data used in preparing the lamp data in the design system 1. These databases 21 and 22 are prepared prior to the designing of the lamp and stored in the database unit 2 of the design system 1.

In the standard database 21, the plurality of standard data that can be used as the source data of the lamp data to be prepared in designing the lamp are stored. In preparation of the standard database, constitutions, shapes, external appearances, performances, manufacturing costs and the like of designed lamps, which are already designed or commercialized, are examined. Then, among those designed lamps, a lamp considered to be appropriate to be used as a model of designing the lamp is selected, thus obtaining a standard lamp (Step S201).

Next, for the selected standard lamp, standard data including information about a constitution thereof and the like, which are necessary upon designing thereof, is prepared (S202). These standard data are to be lamp data for registering to the standard database 21. Moreover, the standard data are prepared by use of a predetermined data format having at least constitution data about the constitution of the standard lamp.

Meanwhile, in the technology database 22, stored is technology data that can be utilized as data for updating the design data by changing the constitution of the lamp, components, shape, materials and the like in the designing of the lamp. As such technology data, for example, there are; standard component data of components that can be used in the lamp; shape templates for changing shapes of respective parts of the lamp; and the like (S301).

Next, description will be made for the design method for a vehicular lamp, which utilizes the data stored in the standard database 21 and the technology database 22. First, according to an order from a client and the like, designing of a vehicular lamp is started (Step S100). In this event, to a lamp to be designed, design conditions, which are conditions that should be satisfied by the lamp, are given (S101). These design conditions include performance conditions and restriction conditions.

The performance conditions are conditions required from the aspects of functions and performance as the vehicular lamp. As specific performance conditions, there are conditions for: optical performance such as a luminous intensity distribution pattern required depending on the type of the lamp as functions of the vehicular lamp; structural performance such as a structural strength of the lamp and the like; thermal performance such as heat resistance in the state of turning on the lamp; and the like.

Moreover, the restriction conditions are conditions given from the aspect of the car body and the like as design conditions for each lamp. As specific restriction conditions, as shape restriction conditions from the aspect of shape thereof, there are conditions for: volume and shape of a lamp housing portion provided in the car body; a shape of a lens outer surface of the lamp, the shape being continuous with other portions of the car body; and the like. Moreover, as appearance restriction conditions from the aspect of external appearance thereof, there are conditions for: a harmony between the external appearance thereof and an external appearance of the other portions of the car body; a design of the car body; and the like.

Based on the design conditions including the performance conditions required as the vehicular lamp and the restriction conditions given to each lamp, the plurality of standard data registered in the standard database 21 are examined, respectively, and one piece of standard data, which will be used as the source data for designing the lamp, is selected from the standard data (S102, a standard data selection step).

By referring to the contents of the design screen displayed on the display unit 5, the designer selects standard data from the standard database 21, the standard data being suitable as the source data for preparing lamp data. Then, via the input unit 4, the designer instructs the standard data selection part 31 of the lamp preparation unit 3 about the standard data to be selected. Based on the contents of the input from the input unit 4, the standard data selection part 31 reads out the instructed standard data from the standard database 21, generates design data used for preparing the lamp data and stores the design data in the design data storage part 33.

Next, the design conditions and constitution and performance of the generated design data are examined, and necessary technology data are obtained from the technology database 22. Then, a necessary part of the design data is updated by use of the obtained technology data, and the lamp data satisfying the design conditions are prepared (S103, a morphing step).

With reference to the contents of the design screen displayed on the display unit 5, the design conditions for the lamp to be designed, and the like, the designer instructs the morphing control part 32 of the lamp preparation unit 3 to update the design data via the input unit 4 by utilizing the technology data stored in the technology database 22 according to need. Based on the contents of the input from the input unit 4, the morphing control part 32 reads out the instructed technology data from the technology database 22, performs morphing of the data, updates a necessary part of the design data and stores the updated data in the design data storage part 33.

To be specific, as described above regarding the design system 1, the shape design part 34 of the morphing control part 32 obtains the shape template from the technology database 22, sets the value of the shape parameter and updates the shape data in the design data (a shape design step). Moreover, the component design part 35 obtains the standard component data from the technology database 22 and updates the component data in the design data (a component design step).

Subsequently, for the lamp data prepared by the selection of the standard data, the generation and the updating of the design data, all of which are carried out by the lamp preparation unit 3, the lamp evaluation unit 6 evaluates performance of the lamp and the like (S104). Then, based on the obtained evaluation results, it is determined whether or not the lamp according to the prepared lamp data satisfies the design conditions given to the lamp (S105). If the design conditions are satisfied, the design data at the point is taken as final lamp data, thus finishing the designing of the lamp (S106). On the other hand, if the design conditions are not satisfied, the design procedure such as the updating of the design data and the like is repeated.

Description will be made for effects of the a design method and design system for a vehicular lamp, a program to execute designing of vehicular lamp and a record medium recording the program according to the above-described embodiment.

In the design system 1 and the design method for the vehicular lamp, which are shown in FIGS. 1 and 3, the program used therein and the record medium used therein, regarding the designing of the vehicular lamp, the standard database 21 registering the standard data about the entire constitution of the lamp and the technology database 22 registering the technology data about the partial constitution of the lamp, the technology data including the shape templates for the shape of the lamp, are prepared in the database unit 2. Then, by using the standard data selected from the standard database 21 as the source data and by referring to the necessary technology data among the data in the technology database 22, the lamp data are prepared by the lamp preparation unit 3.

Here, the standard data, that is data of a standard lamp, is, for example, composed of lamp data of a standard lamp selected from lamps already designed. Such a standard lamp is usually designed so as to satisfy performance conditions required as a vehicular lamp, such as a luminous intensity distribution pattern and the like. Therefore, by converting the above-described standard data into database to be the standard database 21 and utilizing the same as the source data of designing the lamp, it is made possible to improve the design efficiency of the lamp satisfying the design conditions including the performance conditions and the restriction conditions.

Moreover, as the technology data applied to the design data, for example, technology data, which are already used for another lamp and can be suitably applied to the design data of the lamp, such as the shape templates suitably applicable to the shape data in the design data, are selected. Therefore, such technology data are converted into database to be the technology database 22 and is utilized as the data for designing the lamp. Thus, together with the foregoing standard data, it is made possible to improve the design efficiency of the lamp satisfying the design conditions.

Particularly, as the shape template utilized as the shape data of the lamp, parameterized templates, which are composed of data of which specific shapes can be set or changed by the shape parameters, are used. By use of such shape templates, the preparation of the shape data of the respective parts in the design data are facilitated.

Moreover, the standard data registered in the standard database 21 is prepared by use of a uniform data format, and the lamp is designed by using the data format in the design data. Furthermore, as data for updating the design data, the technology data such as the shape templates prepared in the technology database 22 so as to correspond to the data format of the standard data and design data are used. Accordingly, regardless of the type of the standard lamp selected as a model of the lamp and specific updated contents of the lamp data, confirmation, updating and the like of the design data can be performed by taking a similar procedure. Thus, the preparation procedure of the lamp data satisfying the design conditions is simplified.

Moreover, the adoption of the data format as described above is useful from the viewpoint of sharing of the lamp data among respective workers designing the lamp, manufacturing the lamp or the like, or from the viewpoint of utilization of the lamp data after the designing thereof. For example, by preparing the lamp data corresponding to the lamp, which is already designed or is being designed, in a uniform data format, the respective workers can refer to or utilize the lamp data.

Moreover, in the design system 1 shown in FIG. 1, for the lamp preparation unit 3, provided are: the display unit 5 functioning as the display means for displaying design screens and the like, which show the plurality of standard data registered in the standard database 21; and the input unit 4 functioning as the selection instruction means for instructing the selection of the standard data and as the update instruction means for instructing the updating of the design data. By providing the above-described input unit 4 and display unit 5, the designer performing the designing of the lamp can efficiently carry out respective design procedures of the lamp designing with reference to the design screen displayed on the display unit 5.

Detailed description will be made for the technology data such as the shape templates registered in the technology database 22 in the vehicular lamp design system 1 shown in FIG. 1 and for the design method using the technology data.

In this technology database 22, as described above, registered is: the technology data used for the lamp designing that prepares the lamp data satisfying the design conditions. As such technology data, various data can be prepared as long as the data are utilizable in the lamp designing.

Specifically, as the technology data, the technology database 22 preferably has the above-described shape templates as the parameterized data, the data being utilizable as the shape data of the lamp in the design data. As described above, by changing shapes of the respective parts of the lamp by use of the shape template prepared in advance, the lamp data can be efficiently prepared.

Figure 4:
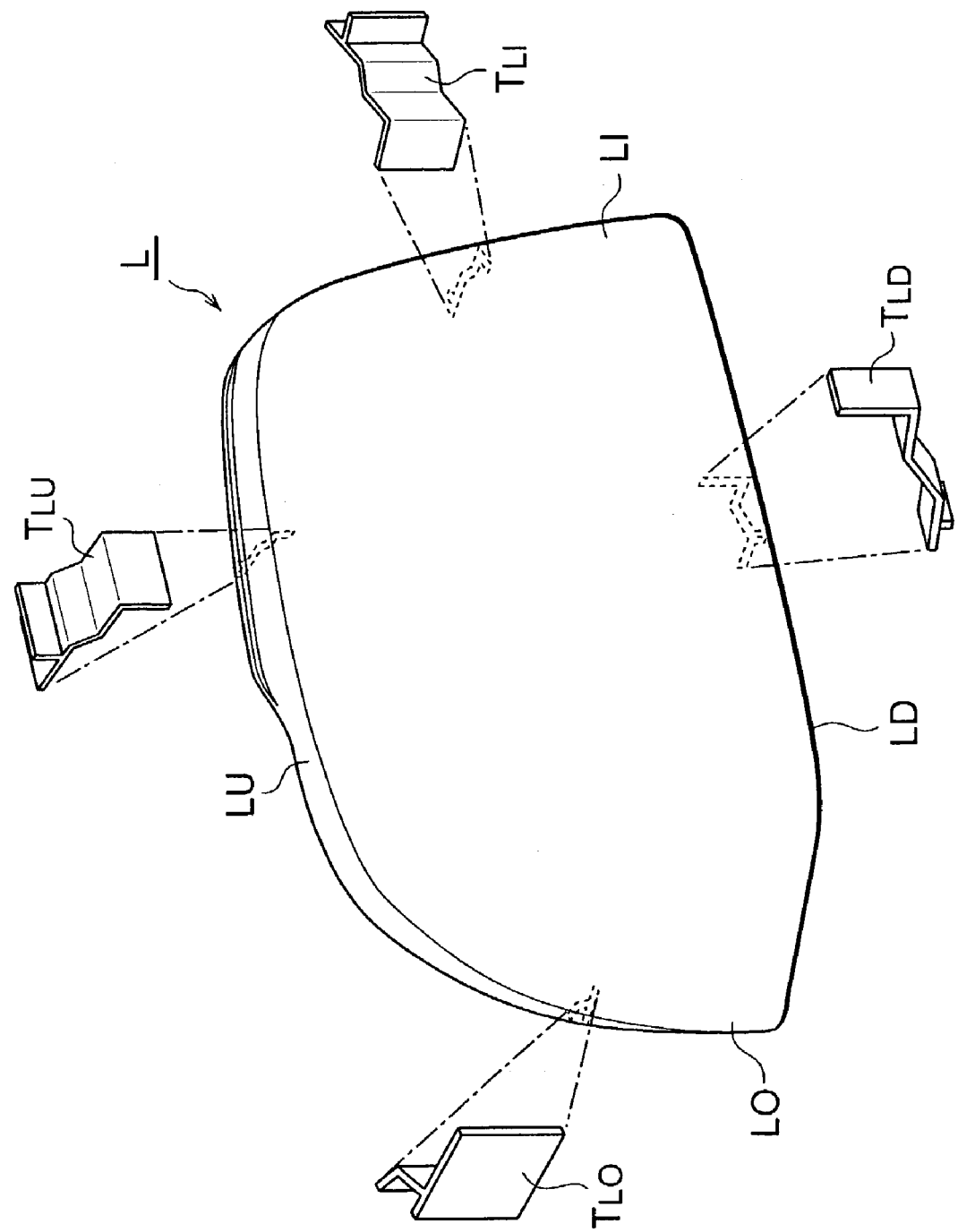
FIG. 4 is a view showing one example of a shape template for a seal leg of a lens.

As the shape template, specifically, there is, for example, data about a shape and the like of a seal leg of a lens used in the lamp (see FIG. 4). The lamp for vehicular lamp constitutes respective components such as a body, a reflector, a lens and the like. The seal leg constituting an outer peripheral portion of the lens is a portion likely to be affected by the restriction conditions such as the design of the lamp and the like. For designing of the shape of such a portion, a shape template deformable by using a shape parameter is previously prepared as the technology data. Thus, the lamp data conforming to the restriction conditions can be efficiently prepared.

Note that, in FIG. 4, as an example of the shape template for the seal leg of the lens, shape templates $T_{LU}$, $T_{LD}$, $T_{LI}$ and $T_{LO}$ for the seal leg at the upper-side surface LU, lower-side surface LD, inner surface LI and outer surface LO of the lens L, respectively, are shown.

Figure 5:
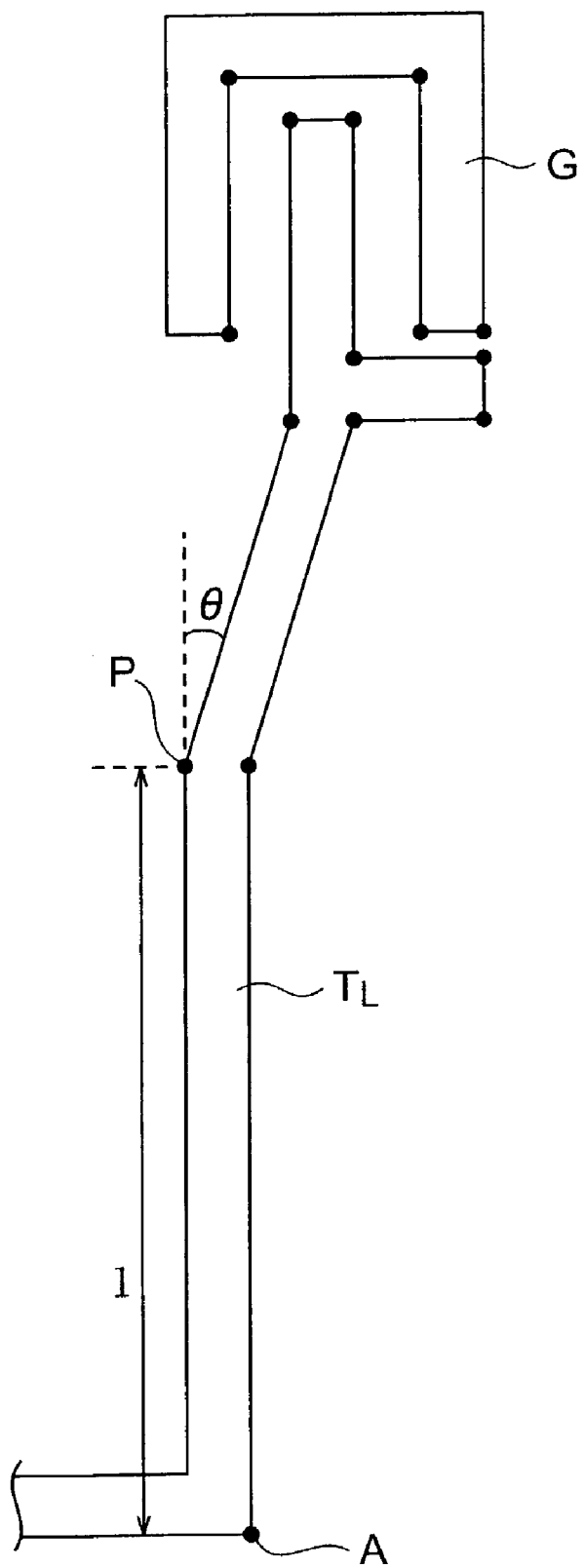
FIG. 5 is a view showing a shape parameter used in the shape template for the seal leg of the lens.

FIG. 5 is a view showing a shape parameter used in a shape template for the seal leg of the lens. FIG. 5 shows an example of the shape template $T_L$ for the seal leg. Moreover, together with this shape template $T_L$, a seal groove G at the body side, which is connected to the seal leg, is also shown in FIG. 5. Moreover, in FIG. 5, reference item A denotes a design line of an exterior shape of the lens L designed prior to the shape design of the seal leg.

In the example shown in FIG. 5, the shape of the seal leg in the shape template $T_L$, which extends from the design line A of the lens to the seal groove G of the body, is specified by a shape obtained by connecting a plurality of shape specifying points shown by black circle points, respectively, with straight lines. In the shape template $T_L$ as described above, for example, the position of each shape specifying point P, the length 1 of the straight line between the shape specifying points, the angle θ made by the two lines at the shape specifying point and the like serve as shape parameters. Then, in the shape design of the seal leg using the shape template $T_L$, values of these shape parameters are properly set, thus designing the shape thereof.

Moreover, with respect to such shape parameters in the shape template registered as the technology data in the technology database 22, the standard data registered in the standard database 21 preferably has restraint condition data for the values of the shape parameters, the values being set in the shape designing. Thus, for the design data generated from the standard data and used in the lamp designing, application and deformation of the shape template can be suitably performed.

For example, in the example shown in FIG. 5, to the length 1 of the straight line between the shape specifying points, the angle θ made by the two straight lines at the shape specifying point, or the like, a numerical value range that can be set in the shape design is given as the restraint condition data. By previously giving thereto such numerical value range as the restraint condition data, the deformation of the shape template in the shape design can be set within a suitable range.

Moreover, as the technology data, the technology database 22 preferably has standard component data utilizable as the component data of the lamp in the design data. As described above, by changing the components of the lamp by use of the standard component data prepared in advance, the lamp data can be efficiently prepared similarly to the shape template. Moreover, by designing the lamp data by use of the standard component data, a lamp that can be easily manufactured at low costs by utilizing the standard components can be obtained.

Figure 6:
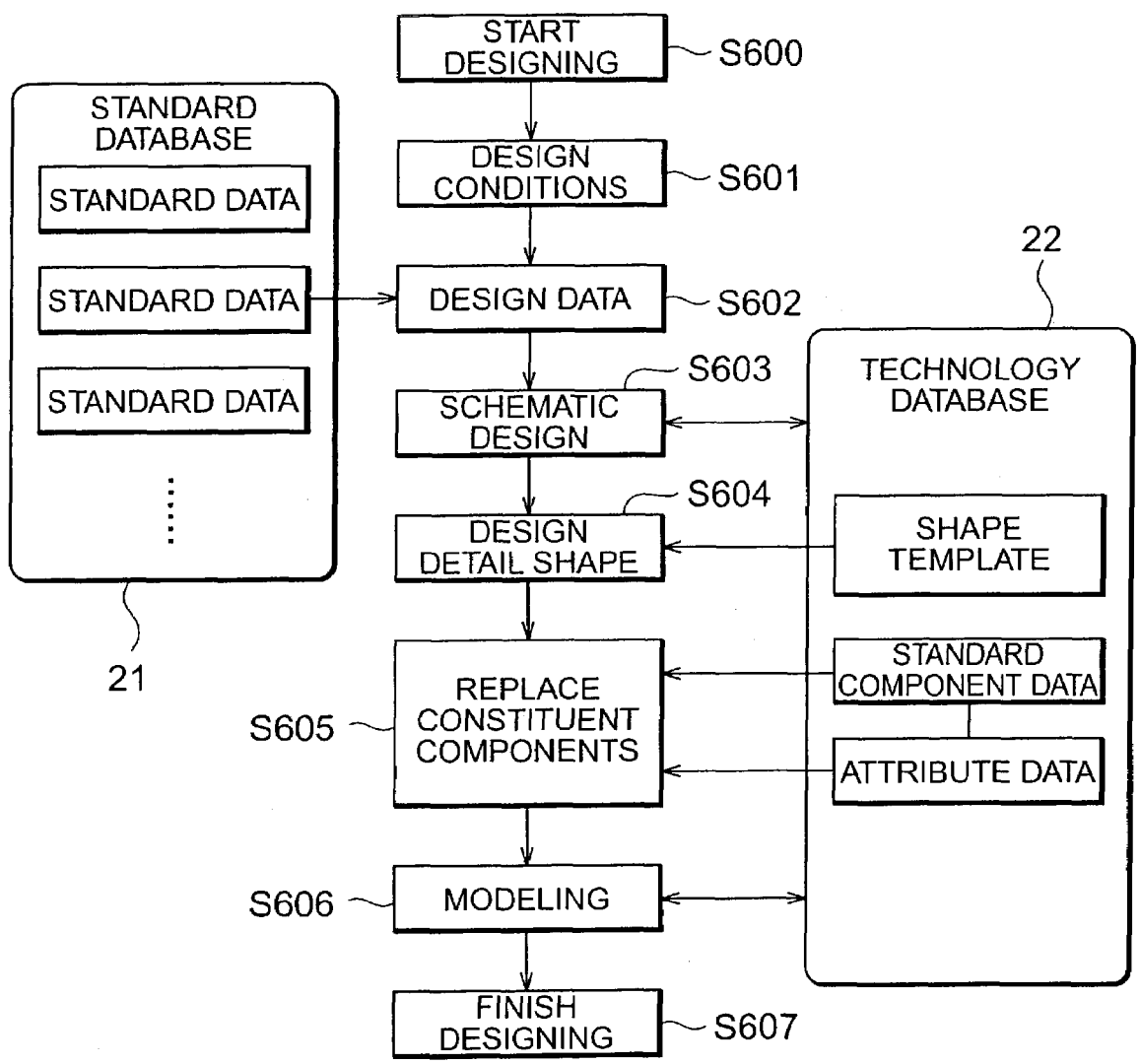
FIG. 6 is a flowchart showing one example of the design method for the vehicular lamp in the case of using a technology database having standard component data and the shape template.

FIG. 6 is a flowchart showing one example of the design method of a vehicular lamp in the case of using the technology database having the standard component data and the shape templates.

First, designing of the vehicular lamp is started (Step S600), and design conditions including performance and restriction conditions that should be satisfied by the lamp are given to the lamp to be designed (S601). Based on these design conditions, suitable standard data are selected as source data from the plurality of standard data registered in the standard database 21, thus generating design data (S602).

Next, for the generated design data, a schematic constitution of the lamp satisfying the design conditions is designed (S603, a schematic design step). Herein, by referring to shape and appearance restriction conditions from the aspect of the car body and the like, an exterior design of the lamp is schematically determined. After the schematic constitution of the lamp is designed, designing of a detail shape is performed for the shape data that requires deformation in the obtained design data, by referring to the shape templates registered in the technology database 22 (S604, a shape design step).

For example, as to the shape data of the seal leg of the lens, of which exterior design is determined, a suitable shape template is obtained from the technology database 22, and a shape template to be applied thereto is changed and a shape parameter thereof is set or changed. Thus, the shape of the seal leg is designed. Moreover, as to the setting of the shape parameter in the shape template, when the restraint condition data are given to the design data generated from the standard data, the shape parameter is set so as to satisfy the given restraint condition data.

Subsequently, for the design data to which the designing of the detail shape is performed, replacement of the constituent components is performed (S605, a component design step). For the respective component data included in the constitution data of the design data, it is examined whether or not the components need to be changed. Then, for the component data that need to be changed, suitable standard component data are obtained from the technology database 22 and the component data are updated. In this event, when attribute data are added to the standard component data in the technology database 22, the corresponding attribute data are also updated together with the component data.

After the updating of the necessary data part related to the shape and components of the lamp is finished, overall modeling including a mold, a manufacturing facility and the like is performed for the prepared lamp data (S606). Then, if there is no problem, the designing of the lamp is finished (S607).

As described above, with respect to the design data used in designing of the lamp, the lamp is designed by taking the design procedure including: the schematic design step of designing the schematic constitution of the lamp; the shape design step of designing the shape constitution by updating the shape data of the lamp by use of the shape template; and the component design step of designing the component constitution by updating the component data of the lamp by use of the standard component data. Accordingly, the necessary data parts as to the shape and components of the lamp in the design data are updated, respectively, and thus the lamp data conforming to the design conditions can be suitably prepared.

Figure 7:
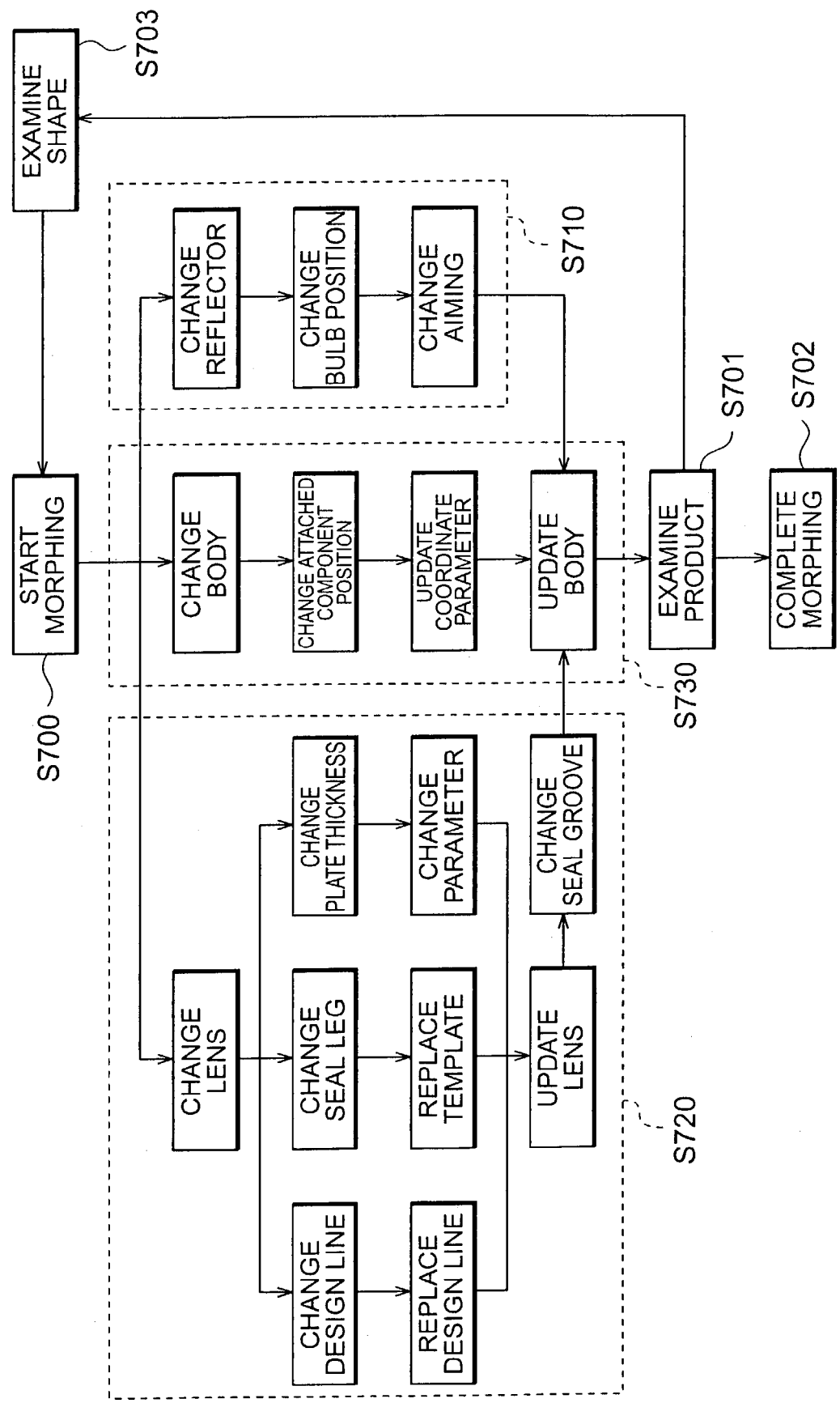
FIG. 7 is a flowchart showing another example of the design method for the vehicular lamp in the case of using the technology database.

FIG. 7 is a flowchart showing another example of the design method for a vehicular lamp in the case of using the technology database. FIG. 7 shows the flowchart of designing when focusing attention on the respective constituent parts and components of the lamp.

First, after generating design data by selecting standard data for the lamp to be designed, morphing of the design data are started for respective parts such as reflector, lens, body and the like of the lamp (Step S700).

As to the morphing of the reflector (S710), constitution and shape of the reflector, which include an exterior shape thereof and a shape of a reflecting surface with respect to a light source bulb, are changed, and a change in a bulb position a change of aiming and the like are performed. Moreover, as to the morphing of the lens (S720), constitution and shape of the lens, which include an exterior shape thereof and a lens step, are changed, and change and replacement of a design line, a change of the seal leg, replacement or deformation of the foregoing shape template, a change of a plate thickness, a parameter change and the like are performed. Thereafter, the lens is updated and a seal groove is changed.

Moreover, as to the morphing of the body (S730) constitution and shape of the body are changed, and positional changes of attached components, updating of a coordinate parameter and the like are performed. Thereafter, the body is updated. Note that, in the updating of the body, the body is updated in consideration for the influence of the updated contents of the reflector and the lens on the body.

After finishing the updating of necessary data parts for the respective parts such as the reflector, the lens, the body and the like, examination of a product as the vehicular lamp is carried out for the obtained design data (S701). If there is no problem, the morphing is completed (S702). Alternatively, the obtained design data are subjected to morphing again after carrying out shape examination (S703).

Figure 8:
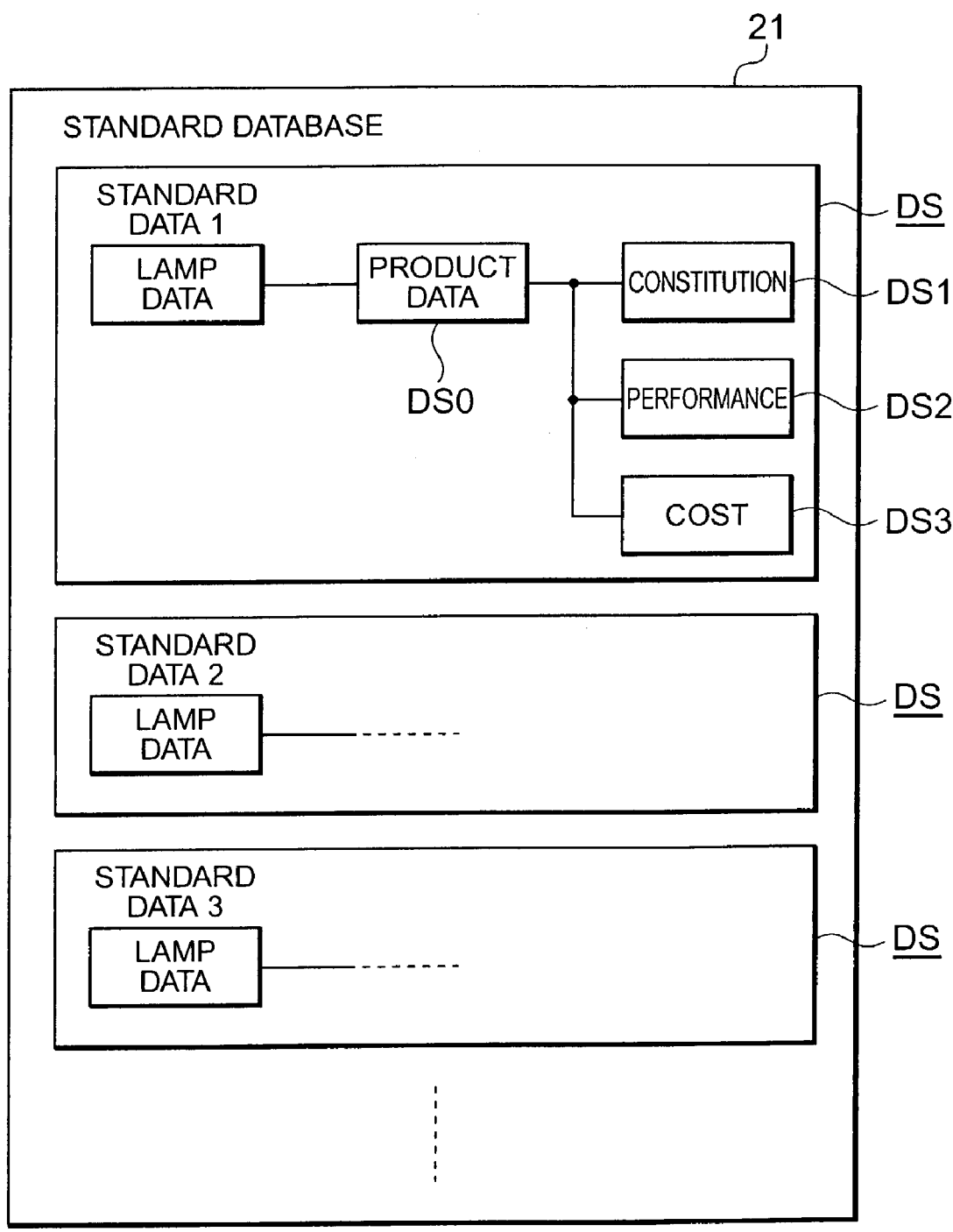
FIG. 8 is a schematic view showing one example of a data format of standard data registered in a standard database in the design system of the vehicular lamp shown in FIG. 1.

Next, the standard data of the lamp, which is registered in the standard database 21 in the vehicular lamp design system 1 shown in FIG. 1, will be described in detail. FIG. 8 is a schematic view showing one example of a data format of the standard data registered in the standard database in the design system of the vehicular lamp shown in FIG. 1.

In the standard database 21, as shown in FIG. 8, a plurality of standard data DS, which can be used as source data for preparing lamp data, respectively, are registered. These standard data DS are composed of lamp data prepared in a predetermined data format as data corresponding to a standard lamp selected from designed lamps.

In the data format shown in the example of FIG. 8, the lamp data of the standard data DS are composed of product data DS0 that are data about a product itself of the lamp. Moreover, these product data DS0 are constituted by having three kinds of data including: constitution data DS1 about a constitution of the lamp; performance data DS2 about performance of the lamp; and cost data DS3 about manufacturing costs in manufacturing the lamp.

Figure 9:
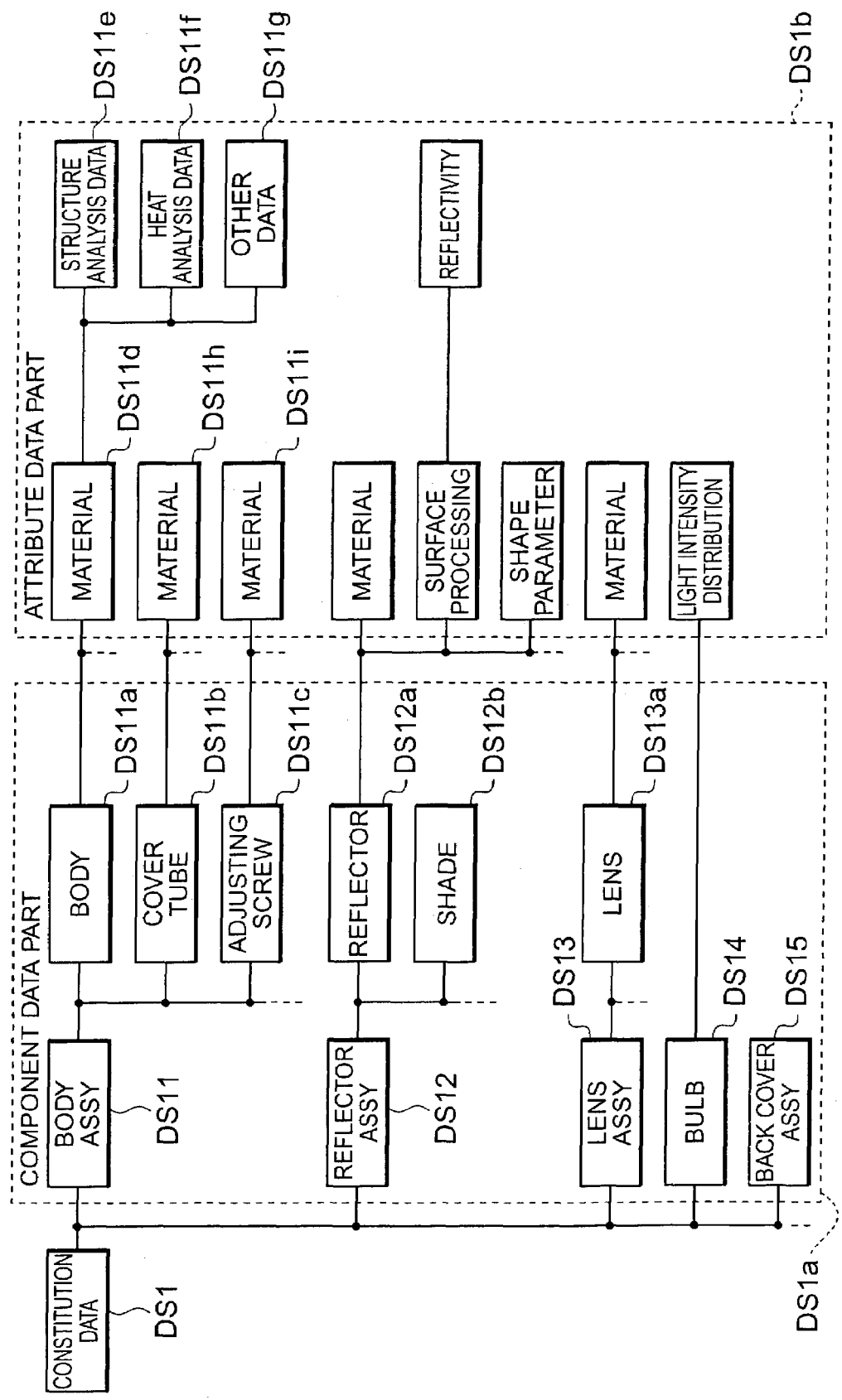
FIG. 9 is a schematic view showing one example of a data format of constitution data in the standard data shown in FIG. 8.

FIG. 9 is a schematic view partially showing one example of a data format of the constitution data in the standard data shown in FIG. 8. The constitution data DS1 is prepared in a data format of a hierarchical type, having: a component data part DS1a including necessary data about components used for the standard lamp; and an attribute data part DS1b including necessary data about attributes of the components in the component data part DS1a.

In the example shown in FIG. 9, the component data part DS1a has: body assembly data DS11 about a component constitution of a body portion of the lamp; reflector assembly data DS12 about a component constitution of a reflector portion; lens assembly data DS13 about a component constitution of a lens portion such as an inner lens, an outer lens or the like; bulb data DS14 about components of a light source bulb; and back cover assembly data DS15 about a component constitution of a rear cover portion.

Moreover, among these component data DS11 to DS15, as to the component data that are not the data of the components themselves but are the data of the component constitutions, there further exist component data, respectively, as low-order data thereof. In FIG. 9, for example, the body assembly data DS11 has, as its low-order component data, body data DS11a, cover tube data DS11b and adjusting screw data DS11c. Moreover, the reflector assembly data DS12 has reflector data DS12a and shade data DS12b. Moreover, the lens assembly data DS13 has lens data DS13a.

Moreover, in the above-described component data in the component data part DS1a, according to need, restraint condition data for the shape parameters in the shape template applied relative to the shapes of the respective parts is prepared. For example, in the case of using the shape template for the seal leg of the lens, as shown in FIG. 5, the restraint condition data of the shape parameters are given to the lens assembly data DS13 or to the lens data DS13a.

For the above-described component data included in the component data part DS1a, attribute data about the attributes of the components in the respective component data are prepared in the attribute data part DS1b.

For example, when checking attribute data, that is low-order data for the body assembly data DS11 in the component data part DS1a, among the attribute data in the attribute data part DS1b, for the body data DS11a, the cover tube data DS11b and the adjusting screw data DS11c, material data DS11d, DS11h and DS11i about component materials as the attributes thereof are prepared, respectively. Specifically, the body data DS11a, the cover tube data DS11b and the adjusting screw data DS11c are the component data constituting the body.

Moreover, for the body data DS11a, in addition to the material data DS11d, structure analysis data DS11e, heat analysis data DS11f and other data DS11g are prepared as low-order attribute data thereof. Moreover, also for the respective component data DS12 to DS15 other than the body assembly data DS11, necessary attribute data are similarly prepared in the attribute data part DS1b.

Figure 10:
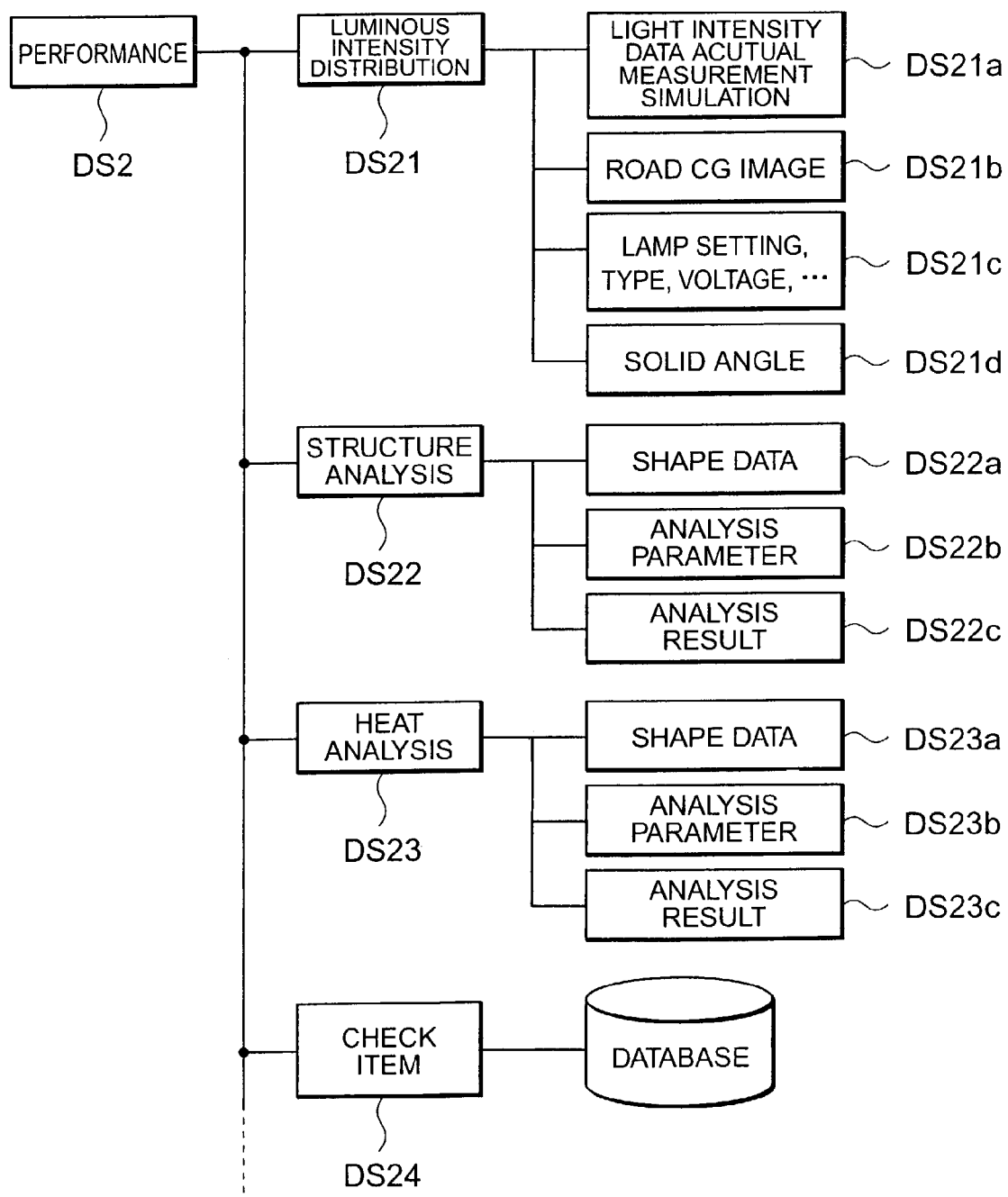
FIG. 10 is a schematic view showing one example of a data format of performance data in the standard data shown in FIG. 8.

FIG. 10 is a schematic view partially showing one example of a data format of the performance data in the standard data shown in FIG. 8.

In the example shown in FIG. 10, the performance data DS2 has: luminous intensity distribution data DS21 about optical performance of a lamp, such as a luminous intensity distribution pattern of emitted light and the like; structure analysis data DS22 about structural performance such as a structural strength of the lamp and the like; heat analysis data DS23 about thermal performance such as heat resistance of the lamp; and check item DS24 showing check contents about the lamp and the like.

Moreover, for these performance data, specific data related to the respective performance data are prepared as low-order data.

For example, for the luminous intensity distribution data DS21, light intensity data DS21a, road surface CG image data DS21b, lamp setting data DS21c and solid angle data DS21d are prepared as low-order performance data thereof. Moreover, for the structure analysis data DS22, shape data DS22a, analysis parameter data DS22b and analysis result data DS22c are prepared. Moreover, for the heat analysis data DS23, shape data DS23a, analysis parameter data DS23b and analysis result data DS23c are prepared.

In data examples shown in FIGS. 8 to 10, the standard data DS is prepared in a data format having the performance data DS2 about the performance of the lamp in addition to the constitution data DS1 about the constitution of the lamp. Thus, in the designing of the lamp, the performance of the standard lamp as the source of the design data can be referred to. Moreover, in the case where the performance of the lamp is evaluated after the necessary part of the design data are updated, the performance thereof can be efficiently evaluated by utilizing the performance data DS2 prepared together with the constitution data DS1 in the standard data DS.

Moreover, the constitution data DS1 of the standard data DS is, as shown in FIG. 9, prepared in a data format of a hierarchical type, having: the component data part DS1a having the component data about the components used for the lamp; and the attribute data part DS1b having the attribute data about the attributes of the components. Thus, in the designing of the lamp, the information about the standard lamp, which includes the attributes such as the materials of the components used for the lamp, can be sufficiently utilized. Moreover, the attribute data as described above can be also utilized for the performance evaluation of the lamp.

Note that the data format of the standard data DS shown in FIGS. 8 to 10 is similarly used in the design data of the lamp, which are generated by the standard data selected from the standard database 21 and updated according to need. For example, in the case of updating the design data having the data format shown in FIGS. 8 to 10, the design data can be updated by changing a necessary data part of the respective data included in the design data.

Moreover, in the updating of the design data as described above, update history data are preferably added to the updated data part of the design data. Thus, the designer, workers other than the designer, who refer to the design data, or the like can confirm updated points and contents of the design data from the standard data. Such update history data can be also utilized, for example, in performance evaluation of the lamp by use of the design data after being updated. Moreover, in the case where the lamp data thus prepared is newly selected to be the standard data and registered in the standard database 21, the previous update history data may be added to the standard data.

As to the above-described addition of the update history data to the design data or the standard data, for example, in the case of changing the adjusting screw used for the body assembly in the constitution data DS1 shown in FIG. 9, the update history data can be added to the adjusting screw data DS11c. Alternatively, apart from the constitution data DS1 and the performance data DS2, the update history data for the entire design data or standard data may be prepared in a lump.

Moreover, for the check item data DS24 of the performance data DS2, which shows the check contents necessary for the lamp, database showing proposed measures corresponding to the respective check contents may be provided together with the data of the check contents. In this case, the updating procedure in the case of further updating the design data based on the result of checking the lamp is simplified.

Next, description will be made for the design screen displayed on the display unit 5 in the vehicular lamp design system 1 shown in FIG. 1.

In the design system 1 shown in FIG. 1, for the designer performing designing of the lamp, the input unit 4 as the input means for inputting information related to the designing of the lamp and the display unit 5 as the display means for displaying information referred to in the designing of the lamp are provided. The designer can prepare the lamp data while exchanging information between the designer and the lamp preparation unit 3 via the above-described input unit 4 and display unit 5.

For example, in the design procedure of the vehicular lamp, as shown in the flowchart of FIG. 3, the designer refers to the design conditions given to the lamp to be designed and selects the standard data used as the source data of designing the lamp from the plurality of standard data registered in the standard database 21. In this event, a selection design screen showing the plurality of standard data registered in the standard database 21 as options of the design data are displayed on the display unit 5 of the design system 1. Thus, the designer can efficiently perform selection of the standard data by referring to contents displayed on the design screen.

Figure 11:
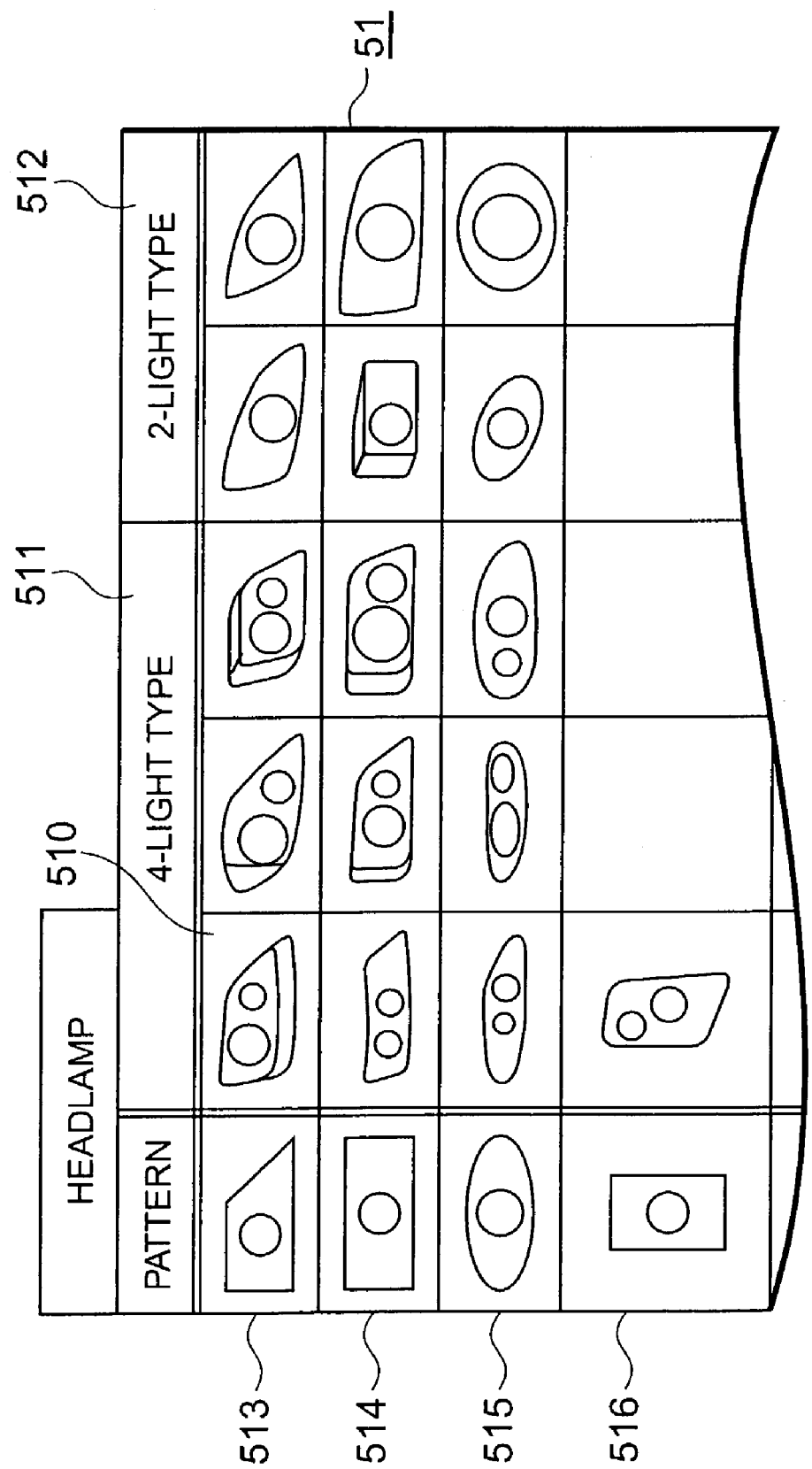
FIG. 11 is a view showing one example of a design screen for selecting the standard data.

FIG. 11 is a view showing one example of the design screen displayed on the display unit 5 for the selection of the standard data. This design screen 51 shows a selection design screen displayed when performing designing of a headlamp as the vehicular lamp.

In this design screen 51, the horizontal direction of the screen 51 is divided into a 4-light type section 511 and a 2-light type section 512 in accordance with the light type of the headlamp. Moreover, in accordance with pattern shapes of the headlamp, the vertical direction of the screen 51 is divided into: a irregular shape type section 513; a laterally long square type section 514; a circle type section 515; and a longitudinally long square type section 516. Then, in respective item sections 510, images of standard lamps corresponding to standard data, which are categorized according to these light types and pattern shapes, are displayed. The designer can refer to the contents displayed on the design screen 51 and can select the standard data used in the designing from the standard data shown in the item sections 510, respectively.

FIG. 12 is a view showing another example of the design screen displayed on the display unit 5 for the selection of the standard data. This design screen 52 shows a selection design screen displayed when performing the designing of the headlamp, similarly to that of FIG. 11.

In this design screen 52, the vertical direction of the screen 52 is divided into a plurality of sections, and the respective sections serve as item sections 520 displaying the standard data. Moreover, in the respective item section 520, display sections such as a light type display section 521, a pattern display section 522, an image display section 523 and the like are provided. The designer can refer to the contents displayed on the design screen 52 and can select the standard data used in the designing from the standard data shown in the item sections 520, respectively, by use of a selection instruction section 525.

Moreover, in the design procedure of the vehicular lamp, besides the selection of the above-described standard data, the designer, as shown in the flowchart of FIG. 3, refers to the given design conditions, makes a confirmation as to design data generated from the selected standard data and updates a part of or all of the design data according to need. In this event, if an update design screen showing the contents of the design data at respective time points of the lamp designing is displayed on the display unit 5 of the design system 1, the designer can refer to the contents displayed on the design screen and can confirm and update the design data efficiently.

Figure 13:
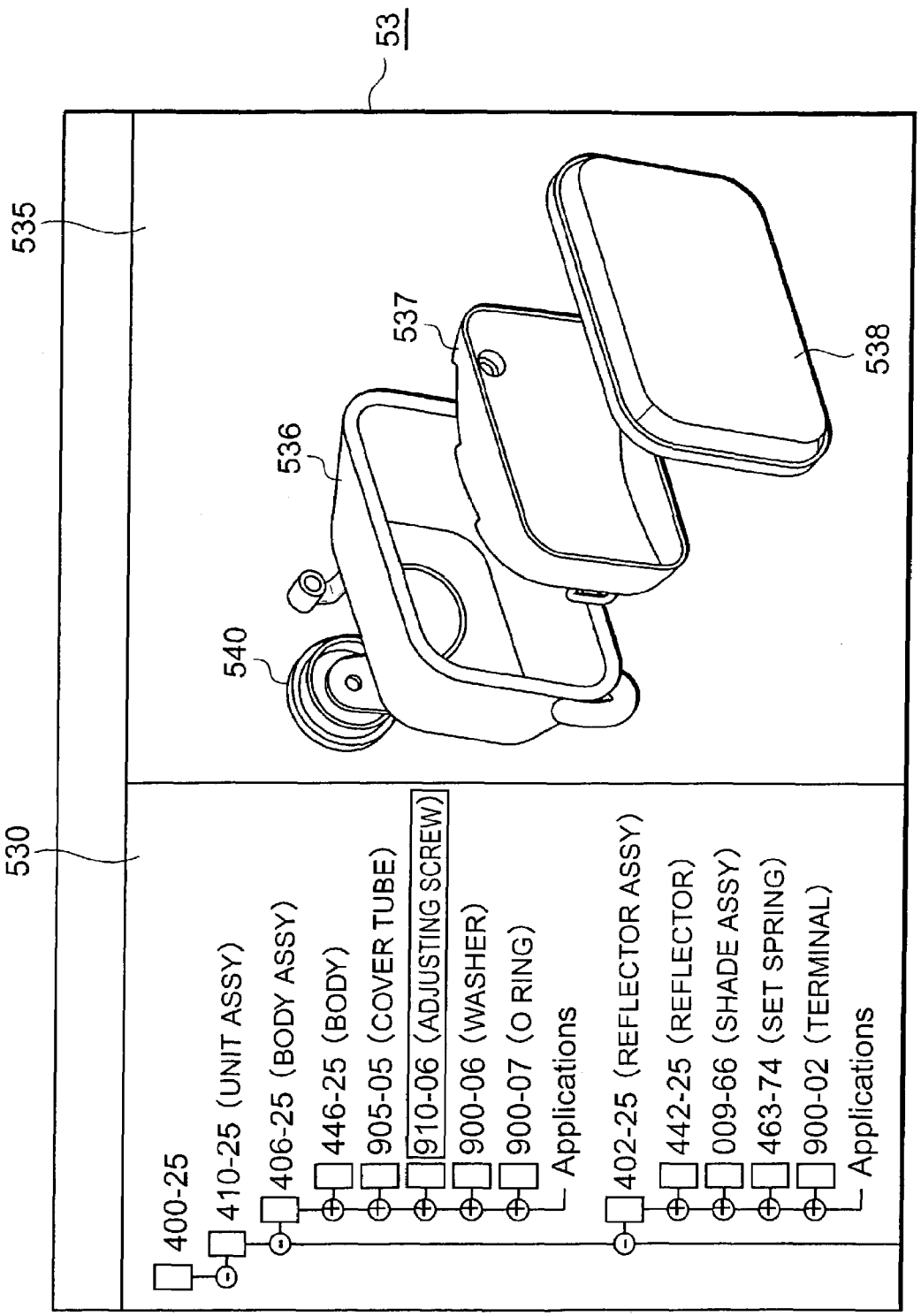
FIG. 13 is a view showing one example of a design screen for confirming or updating design data.

FIG. 13 is a view showing one example of a design screen displayed on the display unit 5 for confirming or updating the design data.

In this design screen 53, the left side thereof is a data display part 530, and the right side thereof is an image display part 535. In the data display part 530, contents of design data having the data formats shown in FIGS. 8 to 10 are displayed along with its hierarchical structure. Moreover, in the image display part 535, an image showing a structure of a lamp corresponding to the design data are displayed.

In the example shown in FIG. 13, in the image display part 535 displaying the image of the lamp, displayed are: a body assembly 536 corresponding to the body assembly data DS11 in the constitution data DS1 (see FIG. 9); a reflector assembly 537 corresponding to the reflector assembly data DS12 therein; a lens assembly 538 corresponding to the lens assembly data DS13 therein; and a back cover assembly 540 corresponding to the back cover assembly data DS15 therein.

According to the design screen 53 as described above, the designer can refer to the contents displayed on the design screen 53, can confirm the contents of the design data at the respective time points of the lamp designing from the data shown in the data display part 530 and the image display part 535, respectively, or can instruct updating of a necessary data part.

Moreover, in the case of updating a part of the design data, as shown in FIG. 13, it is preferable to display the design data so as to make the updated part of the data identifiable. In the example of FIG. 13, for the adjusting screw of which the constituent component has been replaced, component data are displayed by adding a frame surrounding a component number and a component name. Thus, the updated part of the data is made identifiable.

Moreover, in the design procedure of the vehicular lamp, as shown in the flowchart of FIG. 3, the designer obtains the technology data registered in the technology database 22 and utilizes the same in updating the necessary part of the design data. In this event, if a technology design screen showing the technology data registered in the technology database 22 is displayed on the display unit 5 of the design system 1, the designer can refer to the contents displayed on the design screen and can efficiently obtain the technology data.

FIG. 14 is a view showing one example of a design screen displayed on the display unit 5 for obtaining the technology data.

In this design screen 54, the vertical direction of the screen 54 is divided into a plurality of sections, and plural types of the technology data are displayed in the respective sections. The designer can refer to the contents displayed on the design screen 54 and can select technology data used for designing from the technology data shown in the respective sections.

Figure 15:
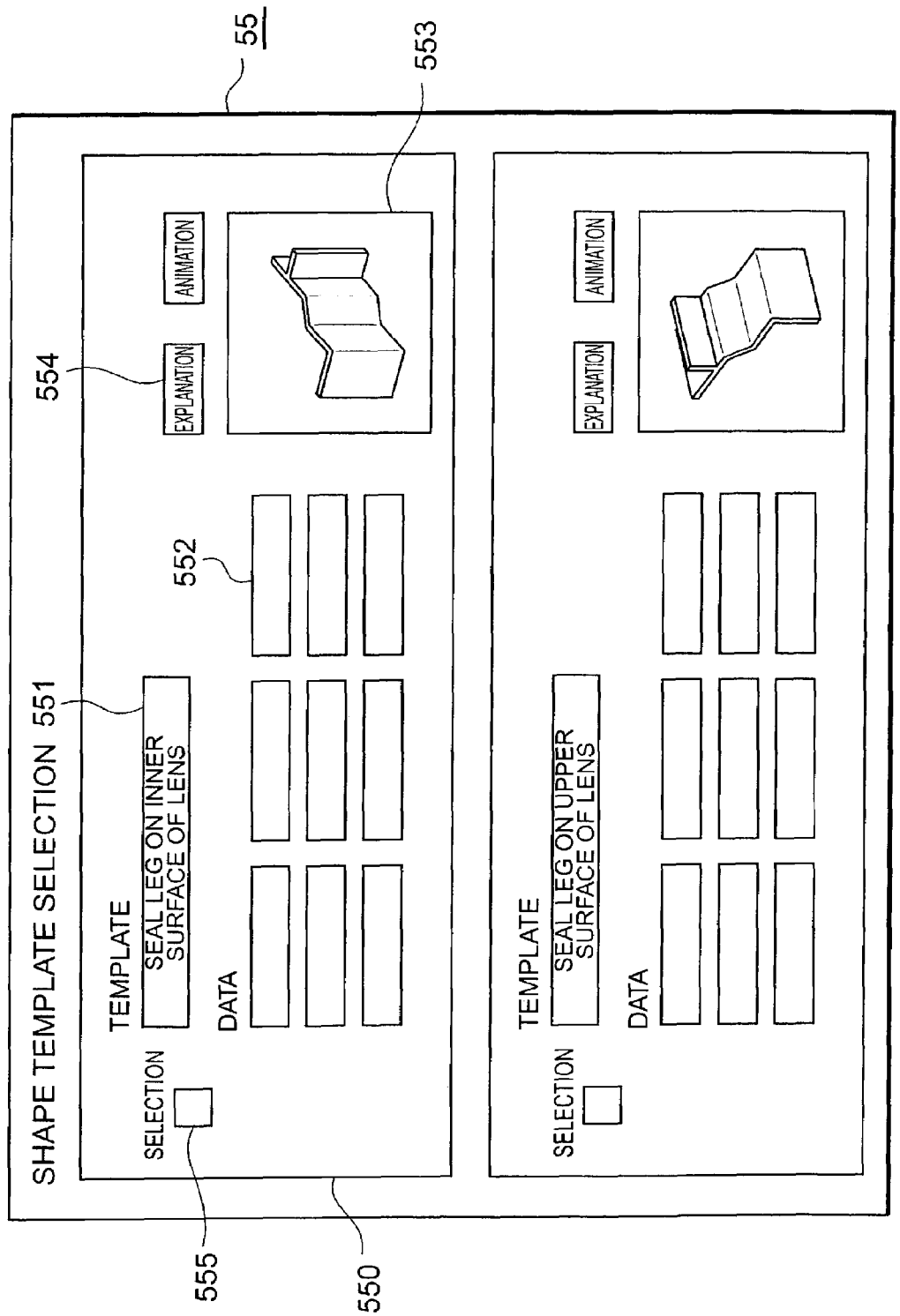
FIG. 15 is a view showing one example of a design screen for selecting a shape template.

FIG. 15 is a view showing one example of a design screen displayed on the display unit 5 for selection of the shape template as the technology data.

In this design screen 55, a plurality of sections are provided in the longitudinal direction of the screen 55, and the respective sections serve as item sections 550 displaying shape templates. Moreover, in each of the item sections 550, provided are display sections including: a name display section 551; a data display section 552; an image display section 553; and the like.

Moreover, by selecting an explanation section 554, it is possible to display an explanation screen for specific information such as shape parameters and the like in this shape template. By referring to the contents displayed on the design screen 55 or further to the contents displayed on the explanation screen, the designer can select a shape template used for designing from the shape templates shown in the respective item section 550 by means of a selection instruction section 555.

The design method and design system for a vehicular lamp, program for allowing a computer to execute designing of the vehicular lamp and computer-readable record medium recording the program according to the present invention are not limited to the above-described embodiment but various changes thereof are possible. For example, in the design system 1 shown in FIG. 1, when it is unnecessary to perform the performance evaluation of the lamp and the like in the design system, the design system may have a constitution having no lamp evaluation unit 6 provided therein.

Moreover, as to the data format of the standard data of the lamp in the standard database 21, the above-described data format is one example thereof, and thus a data format other than the above may be used. For example, in the case where the performance of the lamp can be easily derived from the constitution data, a data format having no performance data may be adopted. Moreover, also as to the contents of the technology data registered in the technology database 22, besides the above-described standard component data and shape templates, various technology data may be used as long as the data are utilizable for the lamp designing.

As described above in detail, the design method and design system for a vehicular lamp, program for allowing a computer to execute designing of the vehicular lamp and computer-readable record medium recording the program according to the present invention achieve effects as below. Specifically, in the design method, design system and the like, the standard database registering the standard data of the lamp designing and the technology database registering the technology data such as the parameterized shape templates utilizable as the shape data of the lamp designing are prepared in advance, the design data are generated by selecting one piece of standard data from the standard database, the shape data in the design data are updated by using the shape template from the technology database, and thus the lamp data satisfying the design conditions is prepared. According to the above-described method and system, a design method, a design system and the like for a vehicular lamp are realized, which can improve an efficiency of designing a lamp satisfying design conditions including performance conditions required as the vehicular lamp and restriction conditions given to each lamp.

What is claimed is:

1. A design method for designing a vehicular lamp, comprising:

a standard data selection step for generating lamp design data by selecting one piece of standard data from a plurality of standard data registered in a standard database based on design conditions including a performance condition required for the vehicular lamp and a restriction condition given for the lamp, wherein the plurality of standard data is utilizable as source data of the lamp design data used for lamp designing, the standard data being prepared, respectively, in a predetermined uniform data format having at least constitution data about a constitution of the lamp, and wherein the restriction condition includes a shape restriction condition and an appearance restriction condition; and a morphing step for preparing lamp data satisfying the design conditions by updating a necessary part of the lamp design data based on the design conditions, and storing the updated lamp design data in a computer-readable storage unit, said morphing step including a shape design step of updating shape data in the lamp design data by obtaining a shape template from a technology database for use as the shape data, the shape template being prepared so as to correspond to the data format of the standard data and having a shape parameter for deformation, and setting a value of the shape parameter to update the shape data.

2. The design method for a vehicular lamp according to claim 1, wherein the standard data in the standard database has restraint condition data previously prepared as a numerical value range for the value of the shape parameter in the shape template in the technology database, the value being set in said shape design step.

3. The design method for a vehicular lamp according to claim 1, wherein, in said morphing step, update history data are added to the updated data part of the lamp design data.

4. The design method for a vehicular lamp according to claim 1, wherein the performance condition comprises a luminous intensity distribution pattern.

5. A design system for designing a vehicular lamp, comprising:

a standard database registering a plurality of standard data utilizable as source data of lamp design data used for lamp designing, the standard data being prepared, respectively, in a predetermined uniform data format having at least constitution data about a constitution of the lamp;

a technology database registering a shape template being prepared so as to correspond to the data format of the standard data and having a shape parameter for deformation, wherein the lamp design data contains shape data and the shape template is for use as the shape data of the lamp in the lamp design data;

standard data selection means for generating the lamp design data by selecting one piece of standard data from the plurality of standard data registered in said standard database based on design conditions including a performance condition required for the vehicular lamp and a restriction condition given for the lamp, and wherein the restriction condition includes a shape restriction condition and an appearance restriction condition; and morphing control means for preparing lamp data satisfying the design conditions by updating a necessary part of the lamp design data based on the design conditions, and storing the updated lamp design data in a computer-readable storage unit, said morphing control means including shape design means for updating the shape data in the lamp design data by obtaining the shape template from said technology database and setting a value of the shape parameter.

6. The design system for a vehicular lamp according to claim 5, further comprising:

display means for displaying at least one of a design screen showing the plurality of standard data registered in said standard database, a design screen showing the technology data including the shape template registered in said technology database and a design screen showing the lamp design data updated by use of the technology data;

selection instruction means for instructing said standard data selection means to select one piece of standard data to be the lamp design data from the plurality of standard data; and update instruction means for instructing said morphing control means to update the necessary data part of the lamp design data.

7. The design system for a vehicular lamp according to claim 5, wherein the standard data in the standard database has restraint condition data previously prepared as a numerical value range for the value of the shape parameter in the shape template in the technology database, the value being set in said shape design means.

8. The design system for a vehicular lamp according to claim 5, wherein said morphing control means adds update history data to the updated data part of the lamp design data.

9. The design system for a vehicular lamp according to claim 5, wherein the performance condition comprises a luminous intensity distribution pattern.

10. A computer-readable record medium recording a program for allowing a computer to execute designing of a vehicular lamp, the program being for allowing the computer to execute:

standard data selection processing for generating lamp design data by selecting one piece of standard data from a plurality of standard data registered in a standard database based on design conditions including a performance condition required for the vehicular lamp and a restriction condition given for the lamp, wherein the restriction condition includes a shape restriction condition and an appearance restriction condition; and morphing control processing for preparing lamp data satisfying the design conditions by updating a necessary part of the lamp design data based on the design conditions, and storing the updated lamp design data in a computer-readable storage unit, said morphing control processing including shape design processing for updating shape data in the lamp design data by obtaining a shape template from a technology database and setting a value of a shape parameter;

wherein said standard database is a database registering the plurality of standard data utilizable as source data of the lamp design data used for lamp designing, the standard data being prepared, respectively, in a predetermined uniform data format having at least constitution data about a constitution of the lamp; and said technology database is a database registering the shape template utilizable as the shape data and including the shape parameter for deformation, wherein the shape template is prepared so as to correspond to the data format of the standard data.

11. The record medium according to claim 10, wherein the program allows the computer to further execute display processing for displaying, on display means, at least one of a design screen showing the plurality of standard data registered in said standard database, a design screen showing the technology data including the shape template registered in said technology database and a design screen showing the lamp design data updated by use of the technology data;

selection instruction processing for instructing selection of one piece of standard data to be the lamp design data from the plurality of standard data; and update instruction processing for instructing update of the necessary data part of the lamp design data.

12. The record medium according to claim 10, wherein the standard data in the standard database has restraint condition data previously prepared as a numerical value range for the value of the shape parameter in the shape template in the technology database, the value being set in said shape design processing.

13. The record medium according to claim 10, wherein said morphing control processing adds update history data to the updated data part of the lamp design data.

14. The record medium according to claim 10, wherein the performance condition comprises a luminous intensity distribution pattern.

* * * * *